United States Patent [19]

Duncan

[11] Patent Number: 4,464,833

[45] Date of Patent: Aug. 14, 1984

[54] VARIABLE RATE CONTROL LOGIC FOR COMPONENT INSERTION MACHINE

[75] Inventor: Robert J. Duncan, Magnolia, Mass.

[73] Assignee: USM Corporation, Farmington, Conn.

[21] Appl. No.: 413,873

[22] Filed: Sep. 1, 1982

[51] Int. Cl.³ .................... B23P 21/00; B23Q 15/00
[52] U.S. Cl. ............................ 29/718; 29/33 K;
 29/33 M; 29/709; 29/713; 29/714; 29/739;
 198/341; 364/478; 364/490
[58] Field of Search ............... 29/713, 714, 715, 716,
 29/717, 718, 709, 741, 739, 33 K, 33 M, 564.1;
 198/341; 414/222; 901/50; 364/167, 478, 479,
 489, 490, 491, 513

[56] References Cited

U.S. PATENT DOCUMENTS

| | | | |
|---|---|---|---|
| 3,710,479 | 1/1973 | Bernardo et al. | 29/741 |
| 3,765,075 | 10/1973 | Olney et al. | 29/739 X |
| 3,824,674 | 7/1974 | Inoyama et al. | 29/717 X |
| 3,837,063 | 9/1974 | Wright | 29/739 X |
| 3,932,931 | 1/1976 | Wright | 29/739 X |
| 3,939,542 | 2/1976 | Reggi | 29/718 |
| 3,961,408 | 6/1976 | Goodsmith et al. | 29/706 |
| 3,965,562 | 6/1976 | Inoyama | 29/714 |
| 4,174,801 | 11/1979 | Holland et al. | 29/718 X |
| 4,193,186 | 3/1980 | Boehler | 29/741 |
| 4,258,459 | 3/1981 | Cantini | 29/33 K X |
| 4,283,836 | 8/1981 | Janisiewicz et al. | 29/741 X |
| 4,290,178 | 9/1981 | Friese | 29/33 M |
| 4,327,483 | 5/1982 | Zemck et al. | 29/741 |

FOREIGN PATENT DOCUMENTS

| | | | |
|---|---|---|---|
| 1435846 | 5/1976 | United Kingdom | 29/718 |
| 797865 | 1/1981 | U.S.S.R. | 29/718 |

Primary Examiner—Carl E. Hall
Assistant Examiner—Ronald S. Wallace
Attorney, Agent, or Firm—William F. White

[57] ABSTRACT

A variable insertion rate control system for a component insertion machine is disclosed. An insertion rate is read and retained by the control system which thereafter authorizes insertion of components at the indicated insertion rate. In order to achieve relatively high insertion rates, the downward stroke of the component insertion head is commanded before the receiving medium is registered in position for receiving the component.

15 Claims, 13 Drawing Figures

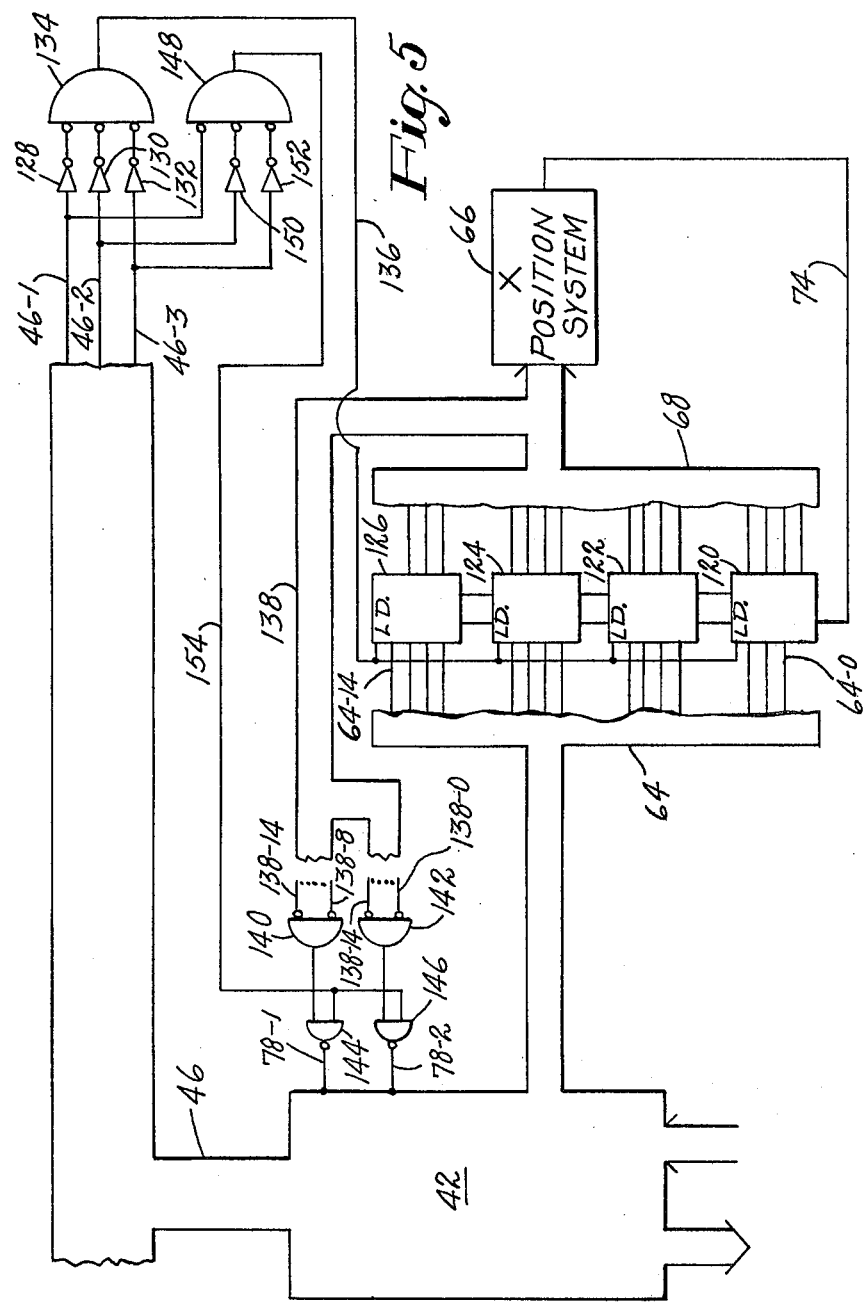

VARIABLE RATE CONTROL LOGIC FOR COMPONENT INSERTION MACHINE

FIELD OF THE INVENTION

This invention relates to machinery which inserts one or more electrical components into a receiving medium such as a printed circuit board. In particular, this invention relates to the control of the rate at which electrical components are inserted into the receiving medium.

BACKGROUND OF THE INVENTION

The automatic insertion or placement of electrical components onto a receiving medium such as a printed circuit board has been heretofore accomplished by various computer controlled machinery. This machinery has typically positioned the printed circuit board underneath an insertion device containing the electrical component that is to be inserted or otherwise placed on the receiving medium. The electrical component has been either an axial lead type of component or a chip containing a number of pins that are to be inserted into designated holes on the printed circuit board. In either case, it is extremely important to accurately register the holes of the printed circuit board for receipt of the bent leads or pins from the component that is to be inserted. It is moreover important that this registration and insertion be accomplished at an extremely fast and predictable rate.

Automatic component insertion machinery has heretofore worked on the premise that the printed circuit board had to be "in position" or accurately registered before the component insertion device could be authorized to proceed downward toward the thus positioned printed circuit board. While the downward motion of the component insertion device is extremely fast, it is nonetheless to be appreciated that the amount of time attributable to this separate and distinct movement can significantly impact the hourly insertion rate of high performance machine. It is moreover to be appreciated that the premising of component insertion on the positioning of the printed circuit board will vary to the extent that the time to position the printed circuit board varies.

OBJECTS OF THE INVENTION

It is an object of this invention to provide a component insertion machine with the capability of accurately controlling the rate at which components are to be inserted or otherwise placed on a receiving medium.

It is another object of this invention to provide a component insertion machine with the capability of initiating a downward stroke of the component insertion head before the receiving medium has been finally positioned for receipt of the component.

SUMMARY OF THE INVENTION

The above and other objects are achieved according to the present invention by providing a component insertion machine with a programmable insertion rate capability. The programmable insertion rate is read and retained within a variable rate control system which authorizes the insertion of a component at the indicated insertion rate. In order to achieve relatively high insertion rates, the downward stroke of the component insertion head is commanded before the receiving medium is registered in position for receiving the component. Provision is made for exiting from an automatic mode of operation if the receiving medium has not reached its final position at a predetermined time during the downward movement of the insertion head.

BRIEF DESCRIPTION OF THE DRAWINGS

The above and other feature of the invention will now be particularly described with reference to the accompanying drawings, in which:

FIG. 5 further illustrates the portion of control system of FIG. 4 associated with the X-Y table;

DESCRIPTION OF THE PREFERRED EMBODIMENT

Figure 1:
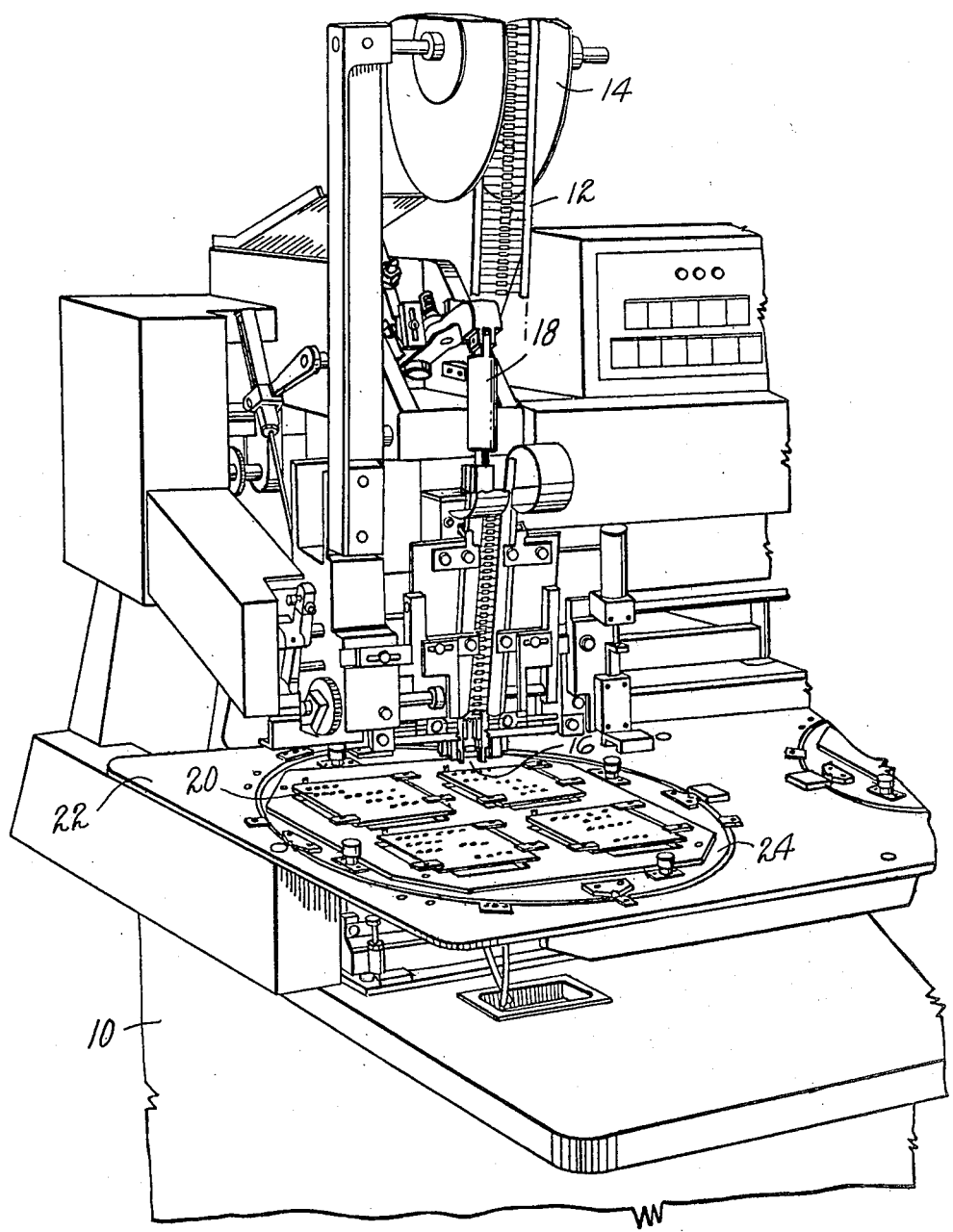
FIG. 1 is an overall view of a component insertion machine having an X-Y table and an insertion head mechanism for axial lead components.

Referring to FIG. 1, a component insertion machine 10 is generally illustrated. The component insertion machine 10 processes axial lead components sequentially arranged on a ribbon 12 that is unwound from a reel 14. The component insertion machine 10 transfers the axial lead components from ribbon 12 to a component insertion head 16 in a well known manner. The component insertion head is thereafter driven downwardly by a drive mechanism 18 so as to insert the bent leads of the component into previously registered holes within a printed circuit board 20. Cutting and clinching mechanisms (not shown) are mounted beneath the board 20 and perform the well known cutting and clinching functions on the thus inserted leads. The component insertion head 16 proceeds to an upward position in a well known manner preparatory to receiving the next component to be inserted. The printed circuit board 20 is simultaneously moved to a new position by an X-Y table 22. The thus positioned printed circuit board is registered underneath the component insertion head 16 in such a manner as to receive the leads of the next component to be inserted. The insertion of components into various portions of the successively positioned circuit board 20 will continue to occur until such time as a circular pallet 24 within the X-Y table 22 is rotated ninety degrees so as to present a new printed circuit board. It is to be appreciated that component insertion machines of the type illustrated in FIG. 1 are well known in the art. The particular component machine illustrated in FIG. 1 is known as the Variable Center Distance Component Insertion Machine, Model F marketed by the Dyna/Pert Division of Emhart Corporation, Beverly, Mass. This machine is further disclosed in U.S. Pat. No. 4,080,730, entitled, "Machine for Assembling Components", issued to Daniel Wayne Woodman, Jr. on Mar. 28, 1978.

Figure 2:
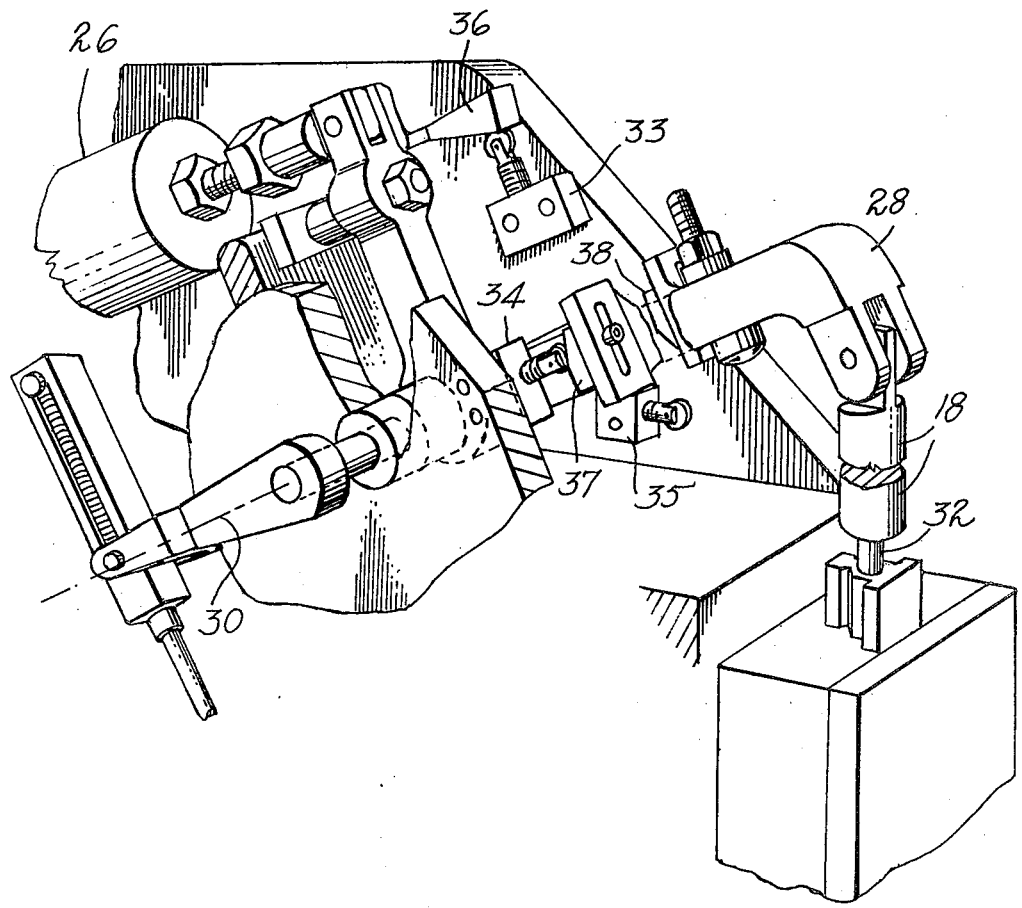
FIG. 2 is a view of the top portion of the component insertion machine illustrating the placement of limit switches in accordance with the invention.

Referring to FIG. 2, the upper portion of the drive mechanism 18 is generally illustrated. The upper portion is seen to include a pneumatic drive cylinder 26 which rotates a coupling 28 about an axis 30 so as to reciprocate a vertical drive member 32 associated with the component insertion head.

The motion of the component insertion head is monitored by three switches. These switches are a "HEAD CLEAR" switch 33, a "HEAD UP" switch 34, and a "HEAD DOWN" switch 35. Each switch is positioned so as to engage a contact member associated with the drive mechanism when the indicated event occurs. In this regard, the "HEAD CLEAR" switch 33 will close when a sloped contact member 36 reaches the point generally illustrated in FIG. 2 wherein the vertical drive member has moved upwardly so as to cause the component insertion head to clear the printed circuit board. The "HEAD UP" switch 34 is depressed by a contact 37 mounted on the coupling 28 at such time as the vertical member 32 moves to the topmost point of its reciprocal motion. The "HEAD DOWN" switch 35 will be depressed by a contact surface 38 when the vertical member 32 reaches a full down position within its reciprocal cycle. It is to be appreciated that the mounting of the switches 33, 34 and 35 as well as the contact members 36, 37 and 38 may change depending upon the particular type of drive mechanism utilized within the component insertion machine. In this regard, the mounting of the switches and the respective contacts is merely by way of illustration for the particular component insertion machine of FIG. 1.

Figure 3:
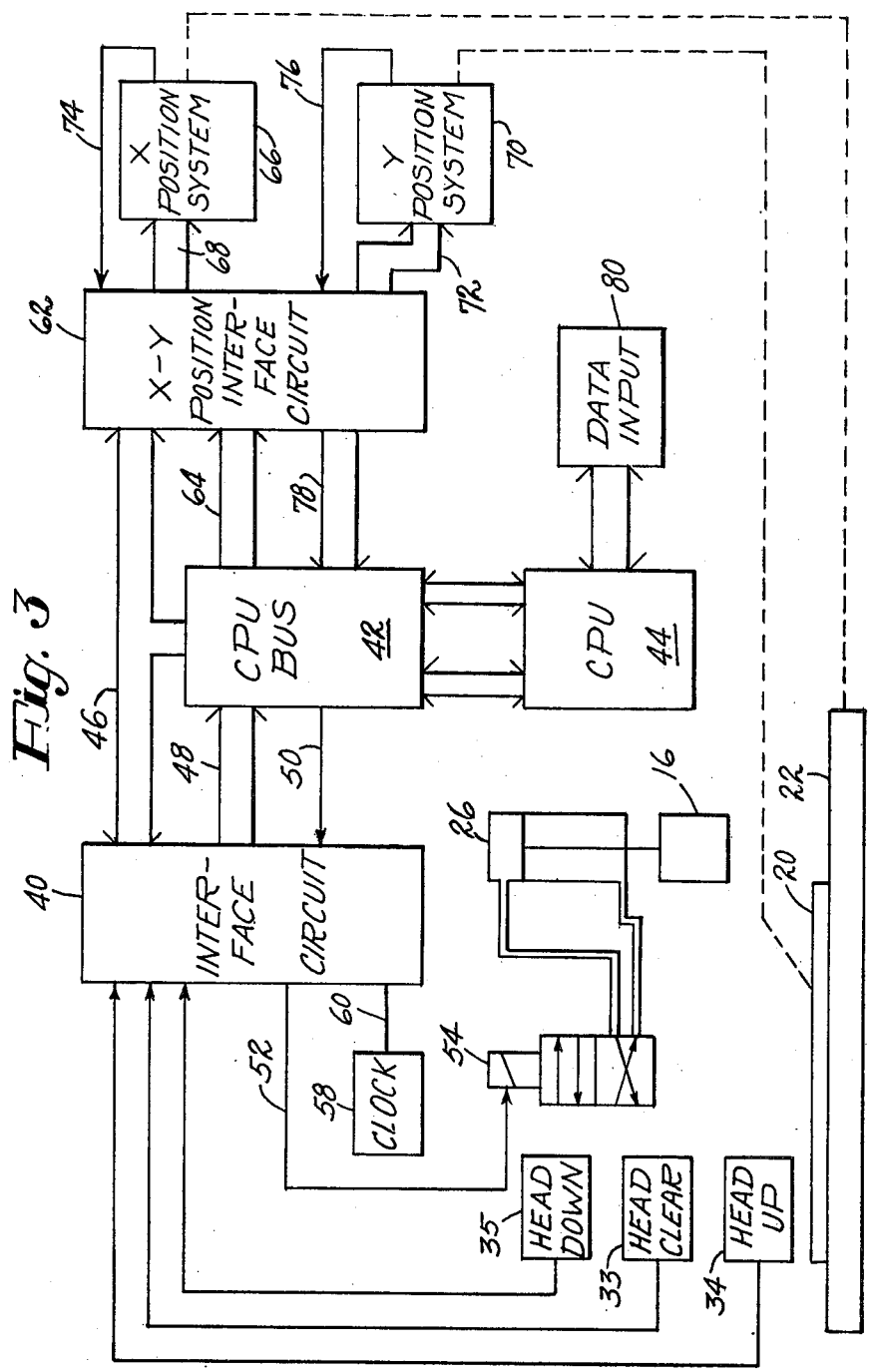
FIG. 3 is a block diagram illustration of the control system which controls the rate of insertion of the components.

Referring to FIG. 3, a rate control system is illustrated in block diagram form for the component insertion machine of FIG. 1. The limit switches 33, 34 and 35 are each connected to an interface circuit 40 which provides input data to a CPU bus 42 associated with a central processor unit 44. The central processor unit 44 is preferably an INTEL 8080 microprocessor. The CPU bus 42 is preferably in INTEL MULTIBUS circuitry normally used with the INTEL 8080 microprocessor. The particular configuration of the INTEL 8080 microprocessor in conjunction with the INTEL MULTIBUS circuitry defines a system for addressing a particular input or output function within the interface circuit 40. The status of the various functions within the interface circuit 40 is provided to the CPU bus 42 via an input bus 48. The single output function is that of an actuation signal appearing on a line 50 which is processed through the interface circuit 40 so as to provide a bilevel signal on a line 52 to a control valve 54 associated with the pneumatic cylinder 26. It is to be appreciated that a predefined signal state of the bilevel signal present on the line 52 will actuate the control valve 54 so as to cause the pneumatic cylinder 26 to drive the component insertion head downwardly. A reversal of the signal state will reverse the control valve 54 so as to allow the insertion head 16 to return to an upward position. The insertion head 16 is schematically shown in the upward position relative to the printed circuit board 20 in FIG. 3.

Referring again to the interface circuit 40, it is seen that this circuit receives a signal from a clock 58 via a line 60. The clock is a standard multi-vibrator circuit configured so as to provide a preferred clock cycle of 10 milliseconds. The status of the clock signal is transferred to the CPU bus 42 via the input bus 48. In accordance with the invention, the status of the clock 58 is sampled at a rate greater than the clock rate so as to allow the central processor unit 44 to maintain an accurate account of the number of clock cycles that have occurred.

Referring again to the CPU bus 42, it is seen that the address bus 46 associated therewith is also connected to an X-Y position interface circuit 62. The X-Y position interface 62 receives X and Y movement data via a bus 64 and in turn provides digital commands to an X position system 66 via a bus 68 as well as a Y position system 70 via a bus 72. Each positioning system has a motorized drive which moves the X-Y table 22 in either the X or Y direction as generally indicated by the dotted line relationships. Each positioning system furthermore feeds back a digital position signal to the X-Y position interface circuit 62 via a pair of lines 74 and 76. These digital position signals are preferably pulse encoded in such a manner that a fed back pulse is equivalent to a single unit of commanded movement to the respective position system. This can be accomplished in a well known manner by providing a position encoder in combination with a pulse generating circuit on the output shaft of each motorized drive. As will be explained in detail hereinafter, the digital position signals are utilized to decrement the digital commands appearing on the buses 68 and 72. The decremented digital commands are utilized by the central processor 44 to control the insertion cycle of the component insertion machine.

It is to be noted that the central processing unit 44 initially receives X and Y movement data in the form of an insertion program which is made available to the central processing unit in a well known manner from a data input source 80. As will be explained in detail hereinafter, the insertion program also contains a particular insertion rate which defines the rate at which components are to be inserted for the particular insertion program. The computer program resident within the central processing unit 44 controls the movement of the insertion head 16 so as to comply with the particular insertion rate that is to be followed for the insertion program. This will be explained in detail hereinafter.

Figure 4:
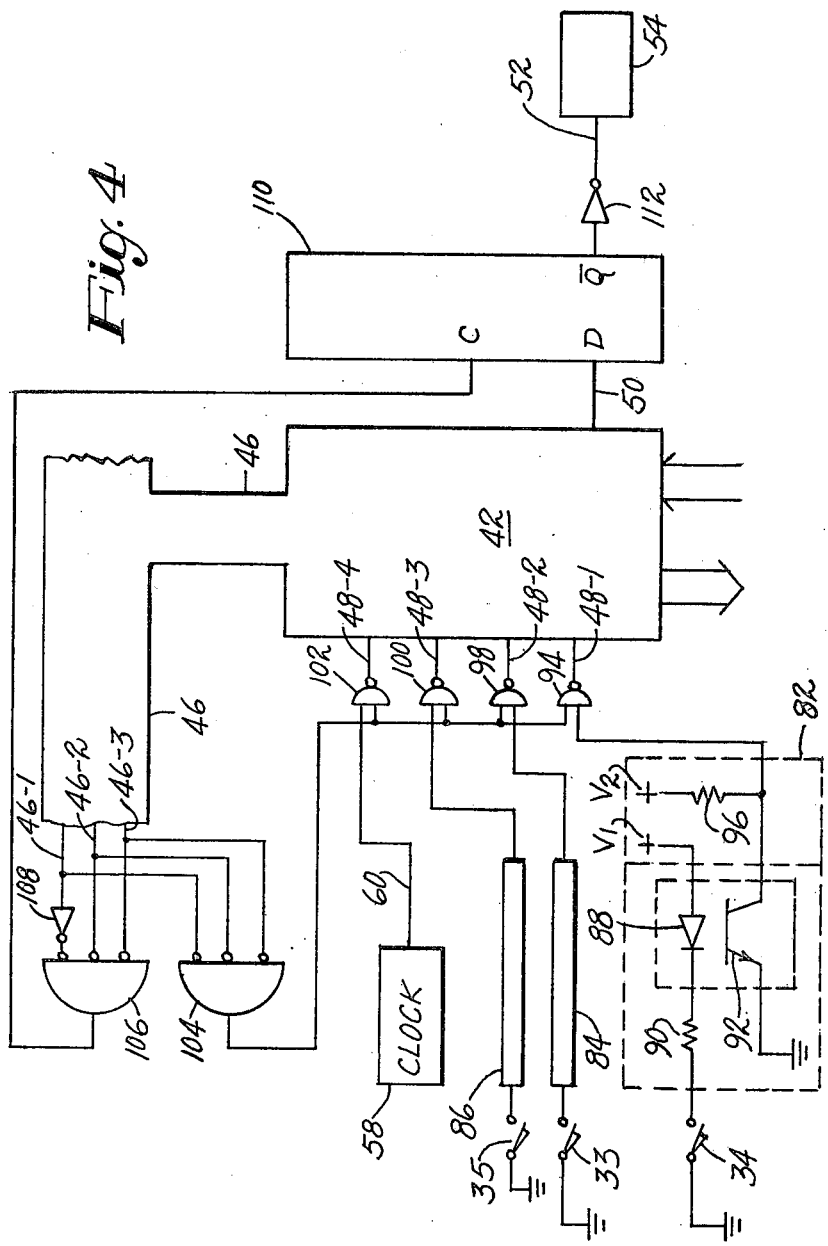
FIG. 4 further illustrates the portion of the control system of FIG. 3 associated with the component insertion head.

Referring now to FIG. 4, the interface circuit 40 is illustrated in further detail. In particular, the interface circuit 40 is illustrated relative to the CPU bus 42, the address bus 46, the switches 33-35, and the control valve 54. Referring to the switches 33, 34 and 35, it can be seen that each of the switches is grounded at one end and connected at the other end to an input circuit 82, 84 or 86. The input circuit 82 associated with the "HEAD UP" switch 34 is illustrated in detail. The input circuit 82 is seen to comprise a photo optically isolated power circuit having a voltage source $V_1$, diode 88 and resistance 90 which become conductive when the "HEAD UP" switch 34 is closed. This in turn causes current to flow in a photo optically sensitive field effect transistor 92 so as to thereby cause the logic level voltage to drop at a NAND gate 94. The logic level voltage is defined by the voltage level $V_2$ and resistance 96. It is hence to be appreciated that a closed switch condition will result in the input to the NAND gate 94 dropping from a logically high to a logically low voltage condition. The input circuits 84 and 86 will cause the same voltage level condition to occur at the respective NAND gates 98 and 100 for closed conditions of the switches 33 and 35. It will be remembered from a discussion of FIG. 2 that each of the switches remains open until the particular event occurs. In other words, the switch 34 will remain open until the component insertion head has reached its upward position. This will be reflected by a logically high voltage level condition occurring at the input of the NAND gate 94 until such time as the head reaches the upward position so as to close the switch 34.

It will be remembered that the interface circuit 40 also receives a clock signal on the line 60 from a clock circuit 58. This clock signal is applied to a NAND gate 102 within the interface circuit 40. The output of each of the NAND gates 94, 98, 100 and 102 are applied to the CPU bus 42 via one of the lines 48-1, 48-2, 48-3, 48-4 within the bus 48. Each of these lines is connected to a particular binary input on the CPU bus 42 which can be directly read by the central processor 44. This reading of the particular input terminal on the CPU bus 42 is a well known capability of the INTEL MULTIBUS.

The current status of the switches 33, 34 and 35 as well as the clock 58 is provided to the particular input terminals on the CPU bus 42 in a manner which will now be described. Referring to the address bus 46, it is seen that 3 separate address lines 46-1, 46-2, and 46-3, are applied to the negation inputs of a gate 104. The gate 104 will switch logically high in response to a logically low or binary zero set of signal conditions appearing on the address lines 46-1, 46-2, and 46-3. The logically high signal condition thus occurring at the output of the gate 104 will enable each of the NAND gates 94, 98, 100 and 102. The logic level signal conditions prevailing at the respective inputs of the NAND gates 94, 98, 100 and 102 will be inverted through the NAND gate before being applied to the input terminals of the CPU bus 42 via the output lines 48-1, 48-2, 48-3 and 48-4. This will result in a logically high signal condition occurring at a binary input terminal of the CPU bus 42 associated with a switch that has been closed. On the other hand, the signal level of the clock signal applied to the NAND gate 102 will merely be inverted at its respective input terminal on the CPU bus. The central processor 44 can hence read the status of any one of the particular switches 33, 34, 35 or the clock 58 by sensing the signal level present at the respective binary input of the CPU bus 42 after having addressed the gate 104 via the address lines 46-1, 46-2 and 46-3.

In a similar manner, the central processor 44 can address a gate 106 by merely changing the signal condition present on the address line 46-1. A binary one signal condition on the line will be inverted by invertor 108 so as to again cause a set of zero signal conditions present at the three respective inputs of the gate 106. This will result in a logically high enabling signal being applied to the clock input of a flip-flop 110. The flip-flop 110 is preferably an edge triggered flip-flop which will respond to the signal occurring at its D input when enabled by a pulse edge (such as a positive signal transition) occurring at its clock or C input. The D input of the flip-flop 110 receives a bilevel signal from the CPU bus 42 via a line 50. The central processor 44 preferably commands a logically high signal on the line 50 when a downward motion of the component insertion head 16 is to occur. This logically high signal condition is clocked into the flip-flop 110 when the gate 106 is appropriately addressed. This will produce a logically low signal at the negation output of the flip-flop 110 which is connected to a buffer amplifier 112. The buffer amplifier 112 provides an appropriate DC voltage level to the solenoid valve 54 via the line 52 so as to cause the valve to assume a position which will produce a pneumatic pressure in the pneumatic cylinder 26 resulting in a downward motion of the component insertion head 16. It is to be noted that the particular DC voltage level will remain on the valve 54 until such time as the flip-flop 110 is again clocked with a logically low voltage level appearing at its D input. At this time, the pneumatic pressure in the pneumatic cylinder 26 will begin to change so as to allow the insertion head to ultimately move upwardly. This will eventually result in the insertion head assuming an up position.

Referring to FIG. 5, a portion of the X-Y position interface circuit is illustrated relative to the CPU bus 42 and the X position system 66. The particular portion which is illustrated in FIG. 5 is the digital logic associated with the X positioning system 66. It is to be appreciated that similar digital logic exists for the Y position system 70.

The CPU bus 42 is operative to generate the magnitude of an X movement command in binary form on a set of fifteen bit lines 64-0 to 64-14 within the bus 64. The magnitude of movement is preferably defined in one thousandths of an inch. In other words, the bit line 64-0 being a binary one would signify one thousandth of an inch movement. The lines 64-0 to 64-14 are connected to a set of four bit counters labeled 120, 122, 124 and 126. Each counter is connected in tandem so that the highest ordered bit input occurs on the line 64-14 and the lowest ordered bit occurs on line 64-0. It is to be noted that the magnitude of movement is preferably accompanied with a directional bit normally included as a sixteenth bit. This directional bit is applied to the X position system 66 in a well known manner so as to allow for the appropriate direction of movement to be followed. This directional bit does not however affect the operation of the circuitry illustrated in FIG. 5 and is hence not shown.

The fifteen bits of information appearing on the lines 64-0 to 64-14 are loaded into the counters 120 through 126 in a manner which will now be described. The central processor unit 44 causes the CPU bus 42 to generate a set of binary one address bits on the lines 46-1, 46-2 and 46-3 within the address bus 46. These logically high signals are inverted by a set of inverters 128, 130 and 132 so as to cause the output of a gate 134 to switch logically high. This produces a "LOAD COUNT" signal on a line 136 which is applied to the load inputs of the counters 120 through 126. This results in a binary count of the X magnitude of movement being applied to the X position system via the bus 68. The X positioning system 66 thereafter implements the movement and provides a pulse signal on the line 74 indicative of the movement of the X position system. Each pulse preferably defines a movement of one thousandth of an inch. A pulse on the line 74 decrements the counters 120 through 126 so as to provide a current binary count on the bus 68 indicative of the amount of movement yet to be implemented by the X positioning system 66. This current count of the amount of X movement yet to be implemented is also carried on fifteen bit lines within a bus 138. The higher ordered bit lines 138-8 through 138-14 are connected to the negation inputs of a gate 140. On the other hand, all bit lines 138-0 through 138-14 are connected to the negation inputs of a gate 142. The gate 140 is operative to generate a logically high signal in response to all higher ordered bits appearing on the bit lines 138-8 through 138-14 being binary zero. It is to be noted that the gate 140 requirement that all higher ordered bit lines be equal to zero is simply another way of stating that the near position condition is satisfied for a numerical value of 255. This numerical value is equivalent to all binary ones being present on bit lines 138-0 to 138-7 and lines 138-8 through 138-14 being logically zero. This would in fact occur at some point as the counters 120-126 are decremented downwardly from a numerical count greater than "255". The switching of the gate 140 to a logical high signal condition is indicative of the X-Y table being near position in the X-direction. This "NEAR POSITION" signal is applied to a NAND gate 144. In a similar manner, the gate 142 will switch logically high in response to binary zero conditions occurring on the bit lines 138-0 through 138-14. This switching to a logically high signal condition is indicative of the X-Y table 22 being in position. This "IN POSITION" signal is applied to a NAND gate 146. The outputs of the NAND gates 144 and 146 are connected to predetermined binary input terminals of the CPU bus 42 via lines 78-1 and 78-2 within the bus 78. The signal levels of the "IN POSITION" and the "NEAR POSITION" signal are gated through to these predetermined binary input terminals on the CPU bus 42 in a manner which will now be described. A gate 148 is addressed by the address "011" appearing on the bit lines 46-1, 46-2 and 46-3 of the address bus 46. The binary one address bits are inverted through inverters 150 and 152 so as to enable the gate 148. This produces a logically high signal on a line 154 which enables the NAND gates 144 and 146. The "IN POSITION" and "NEAR POSITION" signals at the respective NAND gates 144 and 146 are inverted and applied to the predefined binary input terminals of the CPU bus 42 via the bit lines 78-1 and 78-2. In this manner, the current status of the "IN POSITION" signal and the "IN NEAR POSITION" signal is made available to the CPU bus 42.

Referring now to FIGS. 6A through 6G, the operation of the central processing unit 44 is illustrated in flow chart form. It is to be appreciated that this flow chart is embodied in a computer program resident within the central processing unit 44. The programmed central processor unit 44 begins by reading the insertion program data as is indicated in a step 200 in FIG. 6A. In accordance with the invention, at least one word in the insertion program date indicates the particular insertion rate that is to be adhered to during the insertion of the components identified within the component insertion program. The particular insertion rate is preferably expressed in terms of a count of clock pulses to be generated by the clock circuit 58 during a component insertion cycle. This numerical count of clock pulses can either be a separate data word or part of a coded data word. In the latter instance, the coded data word must be decoded and a particular pulse count must thereafter be associated with the thus decoded word. In any event, the central processor 44 in a step 202 stores the count of clock pulses that the clock 58 is to generate during a component insertion cycle. The central processor unit 44 next sets a software reference "CLOCK COUNT" equal to the previously stored count of clock pulses in a step 204.

Following the setting of the "CLOCK COUNT" in step 204, the central processor next addresses gate 104 and reads the status of the clock 58 in a step 206. It will be remembered from the discussion of FIG. 4, that gate 104 may be addressed by generating logically low or binary zero signals on the address lines 46-1, 46-2 and 46-3 within the address bus 46. This causes the gate 104 to produce a logically high signal which in turn enables the NAND gate 102 so as to gate the signal level of the clock pulse signal appearing on the line 60 in an inverted compare the current binary status of the clock 58 with the previously stored status in "CLOCK REFERENCE". The central processor proceeds to ask in step 304 whether the binary status of clock 58 has changed. If the answer is NO, then the NO path is pursued and the central processor returns to the main program in a step 306. On the other hand, if the binary status of the clock 58 has changed then the central processor stores the new binary status in "CLOCK REFERENCE" as is indicated in step 308. The "CLOCK COUNT" is then decremented in step 310 before the central processor proceeds to step 306 and returns to the main program.

Referring again to FIG. 6A, following the steps in the main program of storing the binary status of the clock 58 in "CLOCK REFERENCE", the central processor proceeds to a step 210. The central processor reads a set of X and Y movements from the insertion program data and presents this data to buses 68 and 70. The X and Y movements are preferably sixteen bit data words within the insertion program. Fifteen of these bits define the magnitude of movement in each direction whereas the sixteenth bit indicates a positive or negative direction of movement. The fifteen bits of data which define the magnitude of movement are forwarded to predefined output terminals on the CPU bus 42 associated with the buses 68 and 70. The central processor next loads the fifteen bits of X movement and Y movement into counters associated with the X position system 66, and the Y position system 70 as is indicated in step 212. This is accomplished by addressing gates associated with the transmittal of data to the X position system 66 and fashion to a predefined terminal within the CPU bus 42. The central processor unit 44 is operative to sense the particular binary status of the thus predefined input terminal in step 206. The central processor next stores the thus read binary status of the clock 58 in a "CLOCK REFERENCE".

Figure 7:
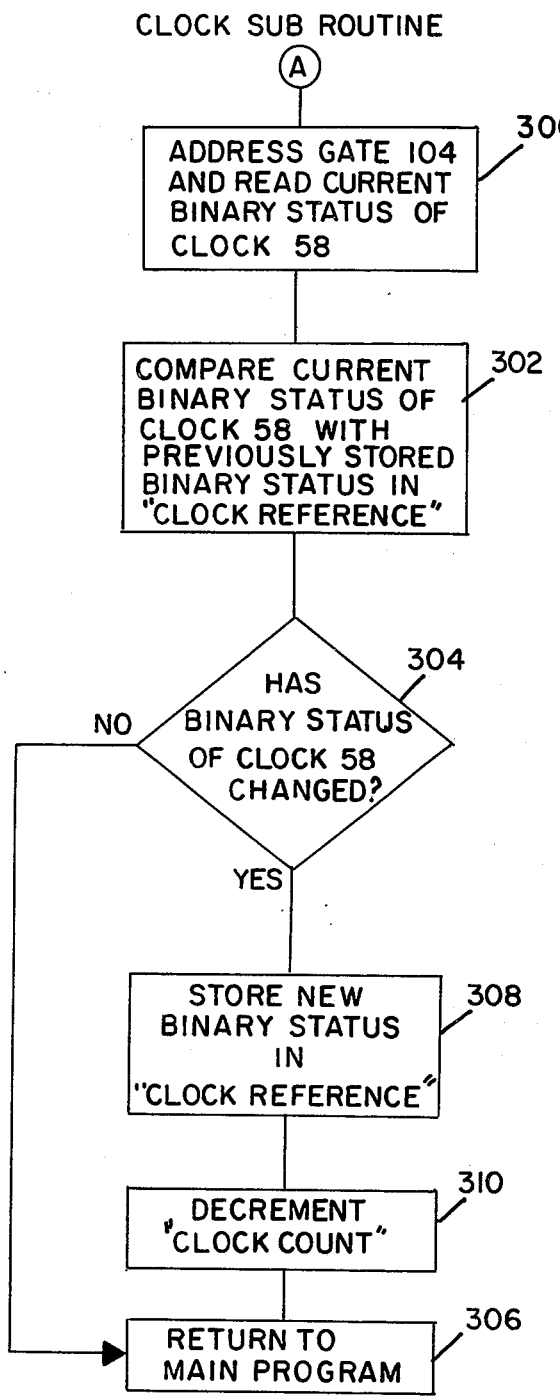
FIG. 7 is a flow chart illustrative of a sub-routine performed by the central processor during the program operations of FIG. 6.

The above steps 204, 206 and 208 define the initial inputs to a clock sub-routine which is illustrated in flow chart form in FIG. 7. As will become apparent hereinafter, the clock sub-routine is periodically branched to in order to note any change in the binary status of the clock 58. Any noted change in the binary status of the clock 58 results in the "CLOCK COUNT" being decremented. In this manner, the central processor is able to maintain an accurate count of the time remaining in a component insertion cycle. It is to be appreciated that the cycle of the central processor will be such as to allow for the execution of a considerable number of computer program steps between executions of the clock sub-routine of FIG. 7. In the preferred embodiment, the cycle time of the central processor unit is so fast as to only require a branching to the clock sub-routine in the event that an internal loop occurs within the main program.

Referring now to the details of the clock sub-routine, it is noted that the clock sub-routine begins with a step 300 wherein a gate 104 is addressed and the current binary status of the clock 58 is noted. This binary status is in fact the inverted signal level of the pulse signal appearing on the line 60 as noted at the predefined input terminal of the CPU bus 42. The next step 302 within the clock sub-routine is to the Y position system 70. Referring to FIG. 5, it will be remembered that the gate 134 is addressed by a set of binary one address bits appearing on the address lines 46-1, 46-2 and 46-3. This results in a "LOAD COUNT" signal appearing on a line 136 which authorizes the loading of the X magnitude of movement data into the respective counters 120, 122, 124 and 126. It is to be appreciated that a similar loading of counters associated with the Y position system would also occur pursuant to step 212. It will be remembered that the X and Y position systems are operative to implement the X and Y movements that have been previously loaded into the respective counters. Each position system provides a feedback pulse signal on either the line 74 or the line 76 which decrements the count previously loaded into the counters in step 212. In the case of the X position system, this results in a current count always being present on the bus 138 in FIG. 5.

Figure 6A:
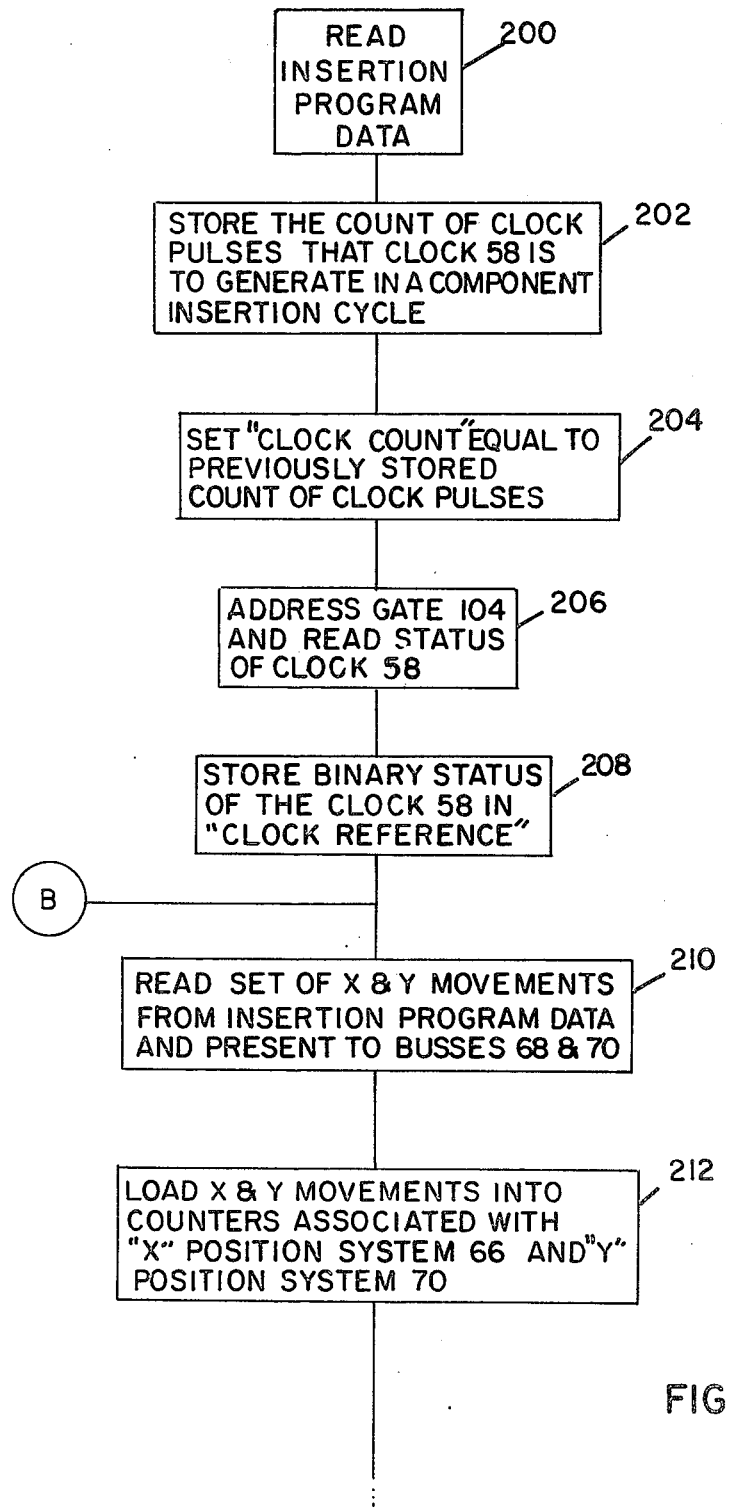
FIGS. 6A-6G contains a flow chart illustrative of the operations performed by the central processing unit within the control system of FIGS. 3-5.
Figure 6B:
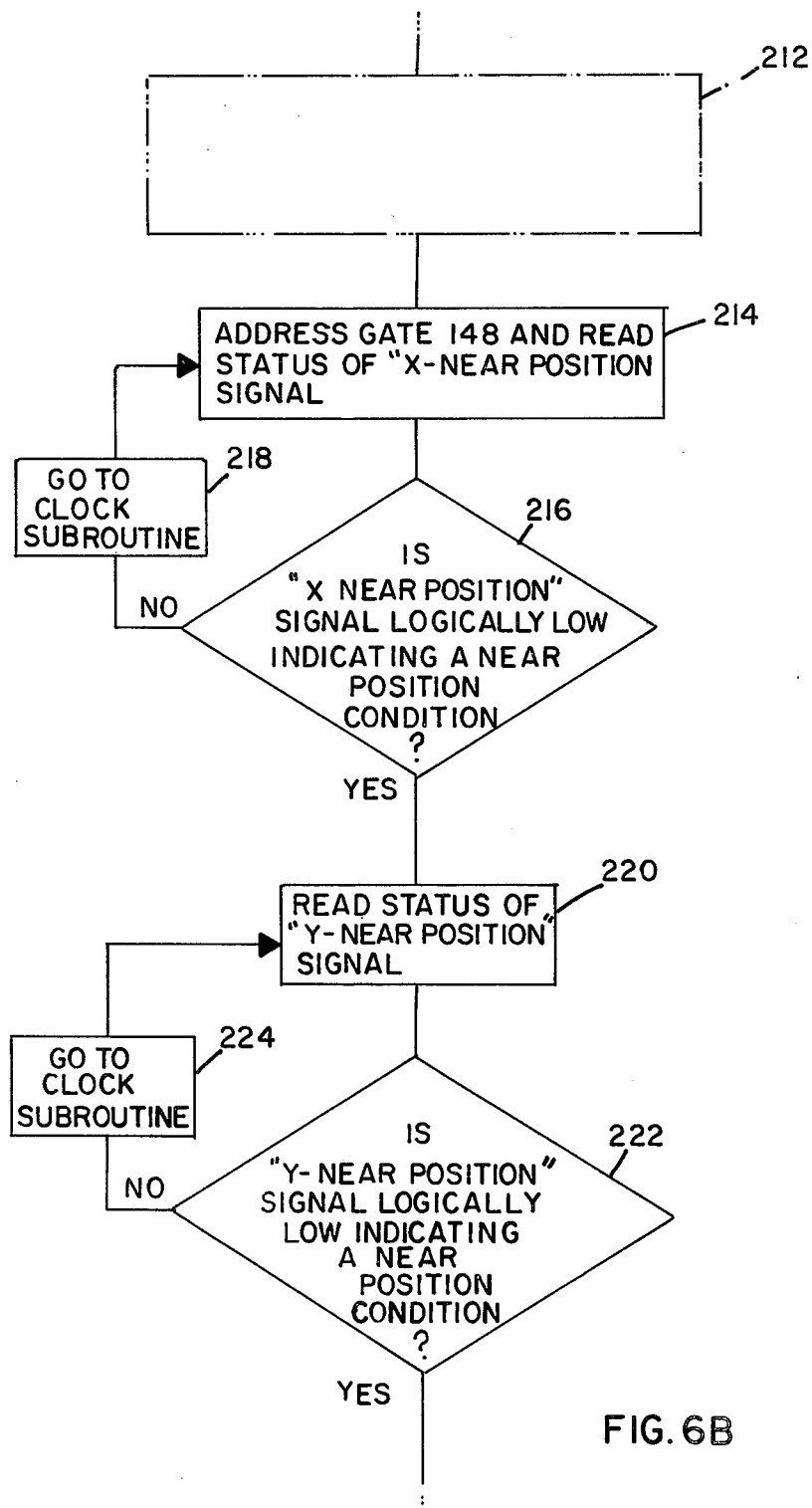

Referring again to the flow chart of FIG. 6B, the central processor proceeds to a step 214 and addresses the gate 148 for the purpose of reading the status of the "NEAR POSITION" signal associated with the X positioning. Referring to FIG. 5, it will be remembered that the addressing of the gate 148 enables the NAND gate 144 so as to gate an inverted signal level of the "NEAR POSITION" signal onto a line 78-1. The line 78-1 is connected to a predefined terminal within the CPU bus 42. The binary status of this terminal can be read as the status of the "X-NEAR POSITION" signal. In this regard, the signal level will be logically low at the predefined input terminal associated with the line 78-1 when the higher ordered bits appearing on the lines 138-8 through 138-14 are all binary zero. This translates to a possible numerical count of 255 described by the lower ordered bits appearing on lines 138-0 through 138-7. The central processor asks in a step 316 whether the "X-NEAR POSITION" signal is logically low at the predefined input terminal. This is an indication that the X positioning system is near to its ultimate position. If the X positioning system has not moved the table 22 accordingly, then the status of the "X-NEAR POSITION" signal at the predefined input terminal of the CPU bus 42 remains logically high and the NO path is pursued to a step 218 which causes the central processor to branch to the clock sub-routine program of FIG. 7. This has become necessary since the main program is now in an internal loop. As has been previously discussed, the clock sub-routine will check to see whether or not a clock pulse has occurred so as to require the decrementing of the "CLOCK COUNT". The clock sub-routine will thereafter exit back to the step 214 for a further check as to the status of the "X-NEAR POSITION" signal. When the "X-NEAR POSITION" signal switches logically low indicating a near position condition, the central processor pursues the YES path out of step 216 to a step 220 which reads the status of the "Y-NEAR POSITION" signal. This is accomplished in much the same manner as has been previously discussed with regard to reading the status of the "X NEAR POSITION" signal in step 214. In this regard, gating similar to that illustrated in FIG. 4, for the X positions system is similarly available for the Y position system 70. This gating would be addressed and the status of the signal would be read at a predefined input terminal within the CPU bus 42. Steps 220 and 224 would be repeated until such time as the "Y-NEAR POSITION" signal dropped logically low so as to indicate a near position condition for the Y direction of movement.

Figure 6C:
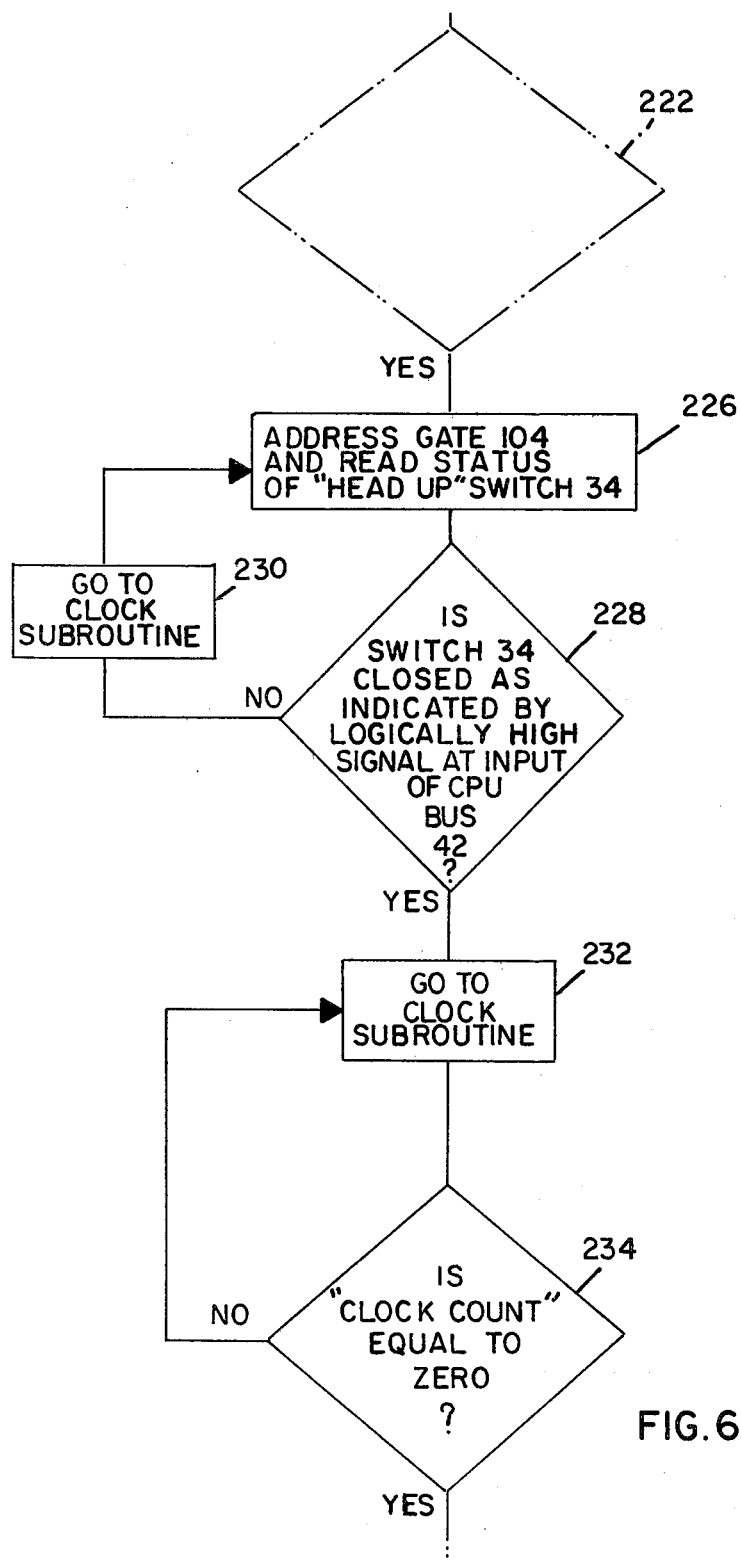

It is to be noted that the YES path out of step 222 is only pursued if near position conditions occur for both the X and Y axes of movement. It is to be appreciated that such a set of mutually exclusive conditions means that the X-Y table 22 may still be in motion but nearing its final position. At this time, the central processor unit in a step 226 addresses the gate 104 and reads the status of the "HEAD UP" switch 34. Referring to FIG. 4, it is seen that the addressing of gate 104 will enable the NAND gate 94 associated with the input circuit 82 for the "HEAD UP" switch 34. The input circuit 82 will produce a logically low signal condition when the "HEAD UP" switch 34 is closed. This logically low signal condition is inverted by the NAND gate 94 so as to produce a logically high signal condition at a predefined input on the CPU bus 42. Referring to FIG. 6C, the central processor in a step 228 will check for a logically high signal condition at the aforementioned input. When the input remains logically low, the NO path is pursued from step 228 to a step 230 wherein the clock sub-routine is executed before again addressing the gate 104 and reading the status of the "HEAD UP" switch 34 in the step 226. It is to be noted that the "HEAD UP" switch will normally be closed at such time as step 228 is originally executed. This will allow the central processor to normally proceed immediately along the YES path from step 228 to a step 232 wherein the clock sub-routine is again executed. The clock sub-routine is executed at this point in time because all other conditions have occurred prior to authorizing the insertion of a component. In particular, the insertion head 16 will be in an up position and the X-Y table 22 will be near to its final position along both the X and Y axes of motion. It is therefore merely necessary to execute the clock sub-routine until such time as the "CLOCK COUNT" reaches zero in a step 234. When this occurs, the central processor resets the "CLOCK COUNT" to the previously stored count of clock pulses in step 202. This is done in a step 236. It is to be noted that step 236 actually marks the beginning of a component insertion cycle. The "CLOCK COUNT" for the cycle will normally be decremented from this point in time. The only instance in which this does not occur is at start-up when the "CLOCK COUNT" is initialized in a step 204. This will be more fully examined hereinafter.

The central processor next generates a logically high signal on the line 50 to the "D" input of the flip-flop 110. This occurs in a step 238 within FIG. 6D. The central processor thereafter addresses gate 106 in a step 240 so as to produce a logically high signal to the clock input of the flip-flop 110 which causes the flip-flop to load the logically high signal appearing on the line 50. This produces a logically low signal condition at the negation output of the flip-flop 110 which is inverted through the buffer amplifier 112 so as to drive the solenoid valve 54 associated with the pneumatic cylinder 26. This results in a downward movement of the component insertion head 16.

Figure 6D:
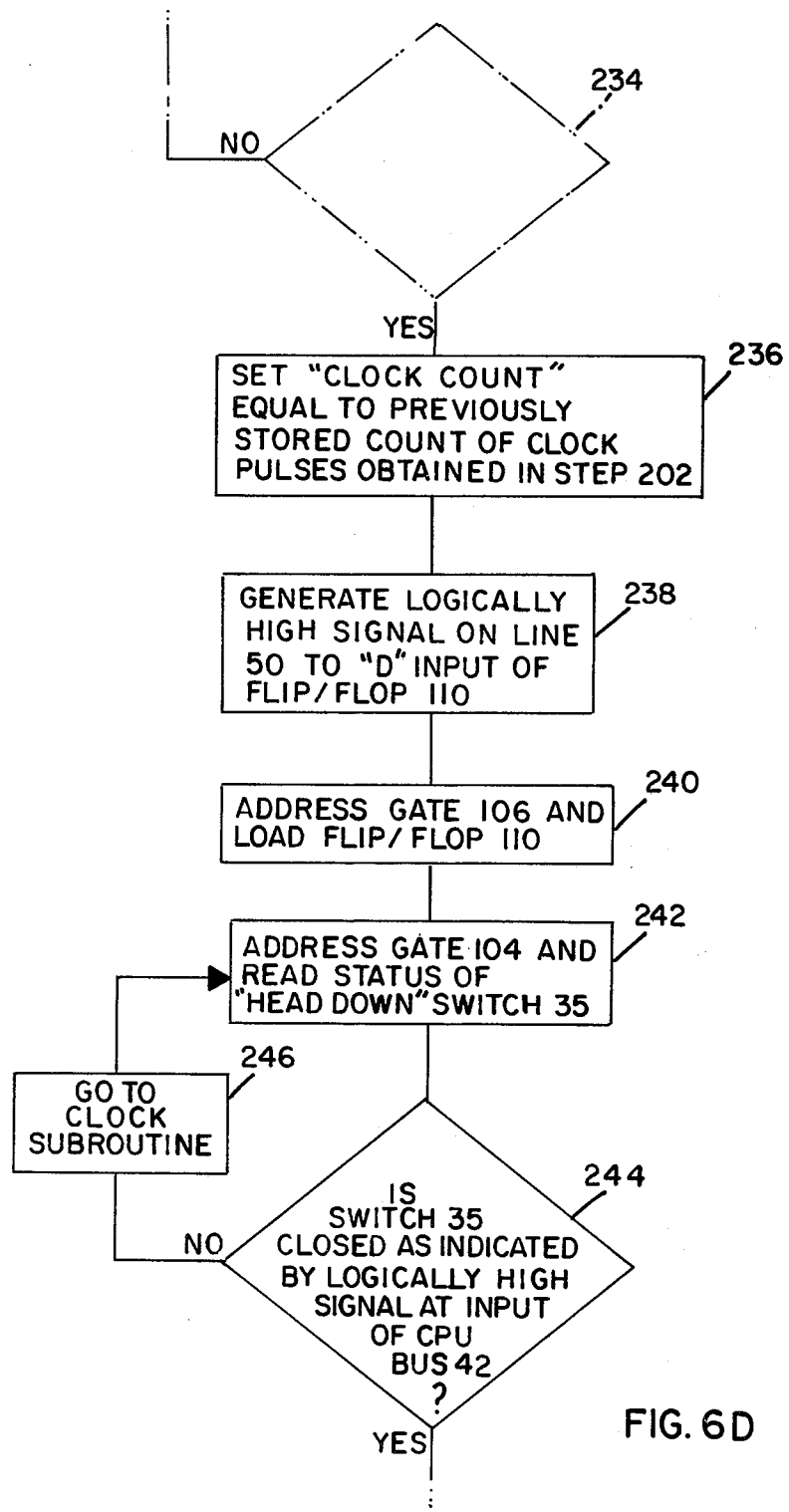
Figure 6E:
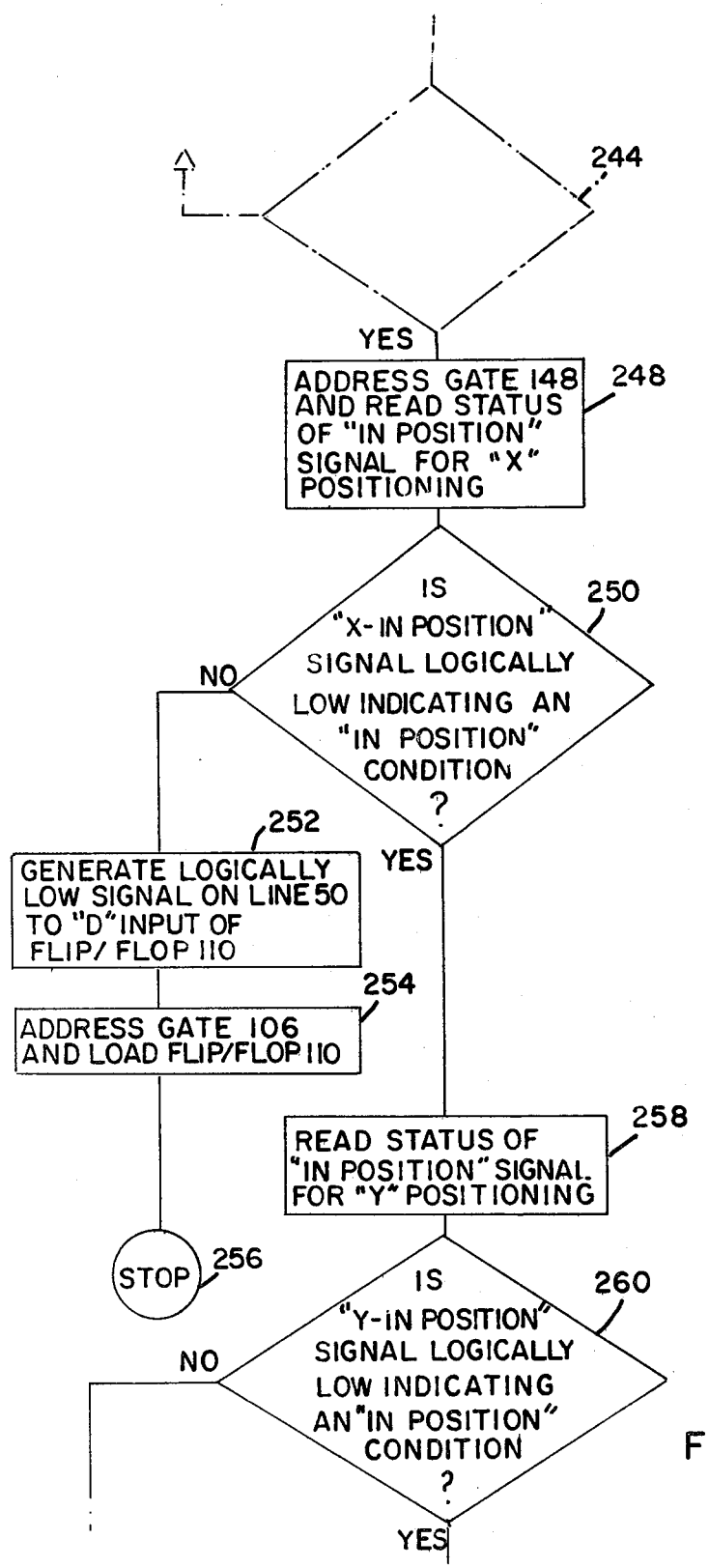
Figure 6F:
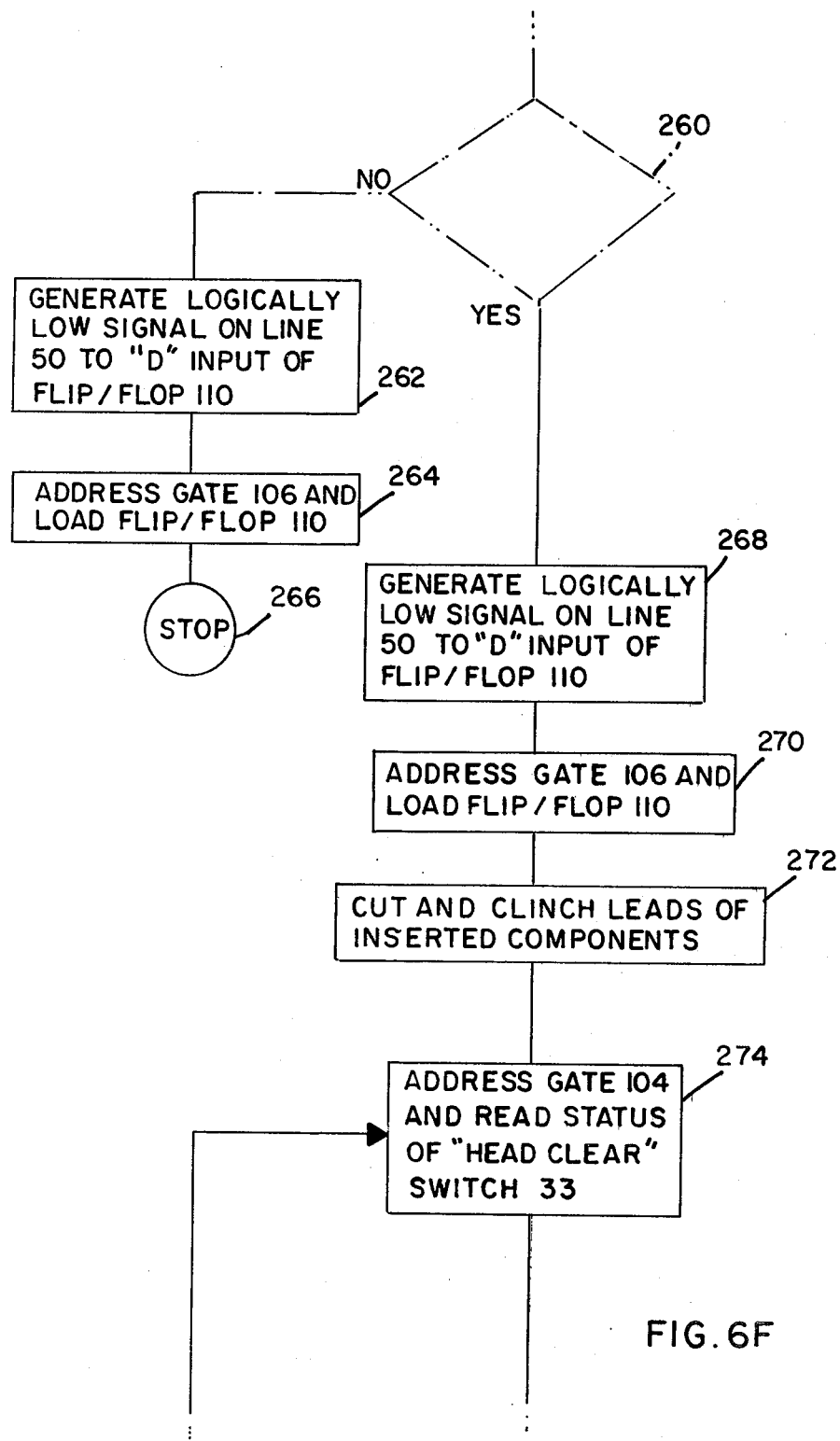
Figure 6G:
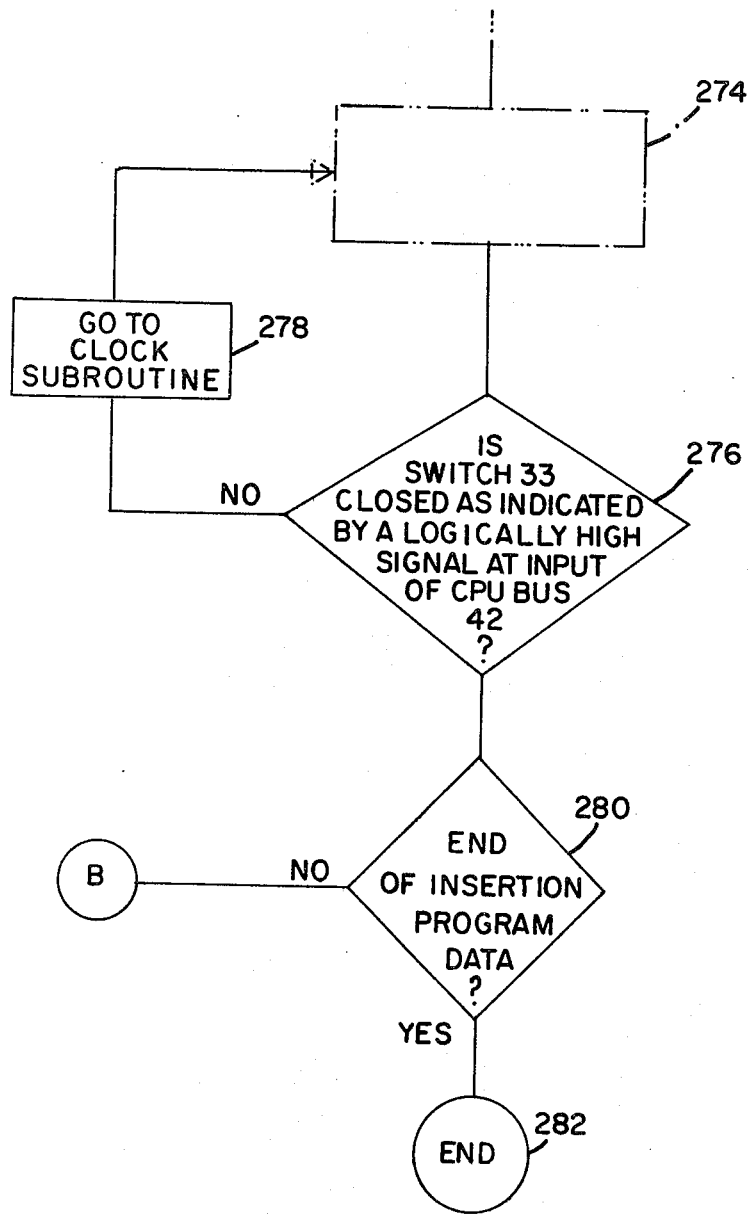

Referring to FIG. 6D, the central processor proceeds to address the gate 104 and read the status of the "HEAD DOWN" switch 35 in a step 242. The central processor is looking for a closed switch condition in a step 244 which will occur when the predefined input associated with the switch 35 is logically high. This will be the predefined input connected to the bus line 48-3 in FIG. 4. In the event that the switch 35 remains open, the central processor branches to the clock sub-routine in a step 246 prior to again addressing the gate 104 and reading the status of the "HEAD DOWN" switch 35. When the switch has closed, the central processor proceeds along the YES path from step 244 to a step 248 wherein the gate 148 is addressed and the status of the "X-IN POSITION" signal is ascertained. Referring to FIG. 5, it will be remembered that the "IN POSITION" signal is generated by a gate 142 when all fifteen bits on the bus 138 are binary zero. This condition will occur when the X movement loaded into the counters 120, 122, 124 and 126 has been decremented to zero. At this time, the "IN POSITION" signal from the gate 142 will be logically high. This signal is inverted through the NAND gate 146 when enabled by an addressing of the gate 148 in step 248. The logically high "IN POSITION" signal will be inverted through the NAND gate 146 so as to be a logically low signal condition on a bus line 78-2 connected to a predefined input on the CPU bus 42.

In the event that the "X-IN POSITION" signal is not logically low, the central processor proceeds along a NO path in such a manner as to terminate the automatic mode of operation. This is accomplished by generating a logically low signal on the line 50 to the D input of the flip-flop 110 in a step 252. The logically low signal condition is loaded into the flip-flop 110 when the gate 106 is addressed in a step 254. This change in signal state of the flip-flop 110 reverses the solenoid valve 54 associated with the pneumatic drive circuit within the pneumatic drive cylinder 26. The response time of the pneumatic drive does not however prevent the component insertion head from attempting to insert the component into the printed circuit board. The automatic mode of operation is however terminated in a "STOP" step 256 which allows for manual intervention by the operator. Corrective measures can be taken at this point in time which are not part of the present invention.

In the event that the X movement has been successfully completed by step 250, the logically low signal condition will occur at the predefined input associated with the "X-IN POSITION" signal. This will allow the central processor to proceed along the YES path from step 250 to a step 258. The central processor will now read the status of the "IN POSITION" signal for the Y positioning. It will be remembered that the logic associated with the Y positioning is essentially the same as that for the X positioning. In this regard, the central processor will again look for a logically low condition at a predefined input for the "Y-IN POSITION" signal in a step 260. In the event that the "Y-IN POSITION" signal is not logically low at the predefined input terminal, then the NO path is pursued in a manner so as to exit from the automatic mode in steps 262, 264 and 266 in precisely the same manner as has been previously described with regard to steps 252, 254 and 256. On the other hand, if the Y movement has been successfully completed, the "Y-IN POSITION" signal will be logically low prompting the central processor to proceed to a step 268. It is to be noted at this point that the printed circuit board 20 has been precisely positioned in both the X and Y directions and is hence in position ready to receive the leads of the component. This will of course require a further downward movement of the insertion head 16. This further downward movement occurs notwithstanding the premature authorization in steps 268 and 270 to reverse the pneumatic valve 56. In particular, step 268 will generate a logically low signal to the D input of the flip-flop 110. This logically low signal condition is clocked into the flip-flop 110 in step 270. This results in a reversal of the solenoid valve 54. The reversal of the solenoid valve does not however immediately result in the reversal of motion of the component insertion head 16. In this regard, the delay associated with the reversal of the automatic component insertion head results in the component insertion head proceeding downwardly so as to insert the component in the thus positioned circuit board 20. The cut and clinching of the leads is accomplished in a step 272 which actually comprises a complete sub-routine that is not part of the present invention. In accordance with the dynamics of the pneumatic drive, the insertion head begins an upward motion following a time delay of 50 milliseconds after step 270. As the component insertion head reverses direction following the aforementioned delay, the central processor is operative to address the gate 104 and read the status of the "HEAD CLEAR" switch 33 as is indicated in a step 274. Referring to FIG. 4, it will be remembered that a closed "HEAD CLEAR" switch 33 will produce a logically high signal at a predefined input on the CPU bus 42 associated with the NAND gate 98. This predefined input is read during step 274. The central processor next asks in a step 276 whether the switch 33 is closed as indicated by a logically high signal at the predefined input of the CPU bus. If the switch 33 has not closed, then the NO path is pursued to a step 278 wherein the clock sub-routine is again executed prior to returning to step 274. The central processor will continue to repeat steps 274, 276 and 278 until such time as the "HEAD CLEAR" switch 33 closes so as to provide a logically high signal at the predefined input of the CPU bus 42. At this time, the YES path is pursued to a step 280 wherein the central processor tests for an end of the insertion program. This can either be a specifically coded data word appearing at the end of the insertion program data or an absence of any further insertion program data. The central processor will come to an end in step 282 in the event that no further data appears in the insertion program data. In this regard, the pneumatic drive within the pneumatic cylinder 26 will merely reposition the component insertion head 16 to an up position as a result of steps 268 and 270.

On the other hand, if the test for the end of insertion program data indicates that further X and Y movements are to occur, the central processor proceeds along a NO path to a junction B in FIG. 6A. Referring to FIG. 6A, junction B occurs above step 210 wherein the central processor reads the next set of X and Y movements from the insertion program data. The central processor will load this set of X and Y movements into the counters associated with the X and Y position systems in step 212. The position systems will immediately begin to move at this point in time. The central processor now monitors the near position status of the X and Y movements in steps 214 through 224. When near position conditions exist along both axes, the central processor will make a perfunctory check to see that the insertion head 16 is in fact in an up position in steps 226 through 230. The last check to be made before authorizing a downward movement of the insertion head is to check the "CLOCK COUNT". In this regard, the operative initiation of the actual component insertion is always limited to the predefined "CLOCK COUNT". It is hence to be appreciated that even though the X and Y positioning systems have moved the X-Y table 22 to a near position condition by the end of step 222, the central processor will nonetheless await the timing out of the cyclical "CLOCK COUNT".

In accordance with the invention, the "CLOCK COUNT" will be preferably set in at least one mode of operation so as to be timed out by step 222. This will allow the central processor to immediately authorize a component insertion stroke in steps 240 and 242 if the component insertion head has reached its up position in step 228. It will be remembered that the X and Y motions will have previously been initiated when the counters were loaded in step 212. This will allow the X and Y positioning systems to be moving at optimal speed by the time head up condition occurs in step 228. This optimal speed of the X and Y positioning systems should be sufficient to allow the remaining distance to be completed before insertion of the component by the head 16. In the event that the X and Y positioning systems are relatively slow to as to not be able to travel the remaining distance, then the "CLOCK COUNT" can be set so as to not immediately expire following step 228. The central processor will hence decrement the CLOCK COUNT in steps 232 and 234 so as to assure that the X and Y positioning systems can achieve the remaining distance. On the other hand, the distance to travel from near position to final position could be redefined to be a smaller distance. This would be achieved by changing the binary signal condition which activates the gate 140. In this regard the gate 140 reacts to higher order bits being zero. The gate 140 could for instance be required to accept the next lower bit line 138-7. This would in effect lower the possible remaining distance to travel as defined by bit lines 138-0 to 138-6.

It is to be appreciated from the above that the faster the X and Y positioning systems are relative to the drive system associated with the insertion head, then the lower can be the count of clock pulses. In this regard, it is to be appreciated that the response characteristics of the X and Y positioning systems may be so quick relative to the insertion head drive as to guarantee the achievement of an in position condition for an appreciable amount of predefined movement taking place between near position and in position.

Taking the above into consideration, the preferred embodiment arbitrarily establishes a near position condition when there is "0.255" inches of movement yet to occur from near position to final position in each direction. This amount of movement corresponds to the binary count of "255" defined by the gate 140 in FIG. 5. This amount of movement occurs in 30-40 milliseconds after the achievement of near position conditions for the X and Y directions of movement. This period of time is to be contrasted with a delayed response time of approximately 50 milliseconds inherent in the pneumatic drive 26 associated with the component insertion head. This delay means the component insertion head will not actually begin to move downwardly until 50 milliseconds have elapsed after step 242. This means that the X and Y positioning systems are relatively fast compared to the pneumatic drive 26 and that the specified distance has been conservatively set. The specified distance could be further enlarged so as to fully utilize all delayed response time of the pneumatic drive. The specified distance could even be further enlarged to take advantage of any time available during the initial downward movement of the component insertion head before the component clear condition has been passed with respect to the printed circuit board. It is to be emphasized however that this latter time utilization would be essentially requiring the X and Y positioning systems to function optimally without any allowance for error.

It is to be noted that the above preferred embodiment does not require that the "CLOCK COUNT" be set in excess of the periodic rate of insertion achievable by the drive associated with the component insertion head. In this regard, the dynamic characteristics of the X and Y positioning systems easily achieve the goal of final position within the allotted time after authorizing the downward movement of the head in step 242. The "CLOCK COUNT" can hence be set equal to the number of clock count pulses corresponding to the periodicity of the insertion head. This is "260" milliseconds in the preferred embodiment which translates to a "CLOCK COUNT" of "26".

It is to be noted that several predetermined counts of clock pulses may be utilized to further slow the rate of component insertion from the fastest rate of insertion. Any larger counts of clock pulses specified in step 202 in response to an indicated insertion rate in the insertion program data will in accordance with the invention further postpone the authorization of a downward stroke by the insertion head. These larger counts of clock pulses could even encompass the arrival at an in position status. In this manner, the component insertion machine can be made to operate at a variety of speeds which do not necessarily depend on the timing of a given event occurring i.e. an in position condition.

It is to be appreciated that a preferred embodiment of a rate control system has been disclosed for a component insertion machine. Portions of this control system may be changed without departing from the scope of the invention. For example, the insertion rate or count of pulses need not be specified in the insertion program itself. This could be provided to the control system via a separate entry from a movable dial or other entry device. Furthermore, the specific drive associated with the component insertion head and the X-Y position systems may vary without departing from the scope of the invention.

What is claimed is:

1. In an electrical component insertion machine wherein electrical components are selectively inserted into a receiving medium positioned beneath a component insertion head, a system for controlling the rate at which the electrical components are inserted, said system comprising:
   means for verifying that the receiving medium has reached a position relative to a final commanded position whereby only a finite, predetermined distance remains to be traveled by the receiving medium in at least one direction; and
   means, responsive to the verification, for initiating an insertion stroke by the component insertion head during the time in which the finite predetermined distance is being achieved.

2. The system of claim 1 further comprising:
   means for arbitrarily defining a plurality of insertion rates for the component insertion machine;
   means responsive to each arbitrarily defined insertion rate for specifying a period of time associated with each rate; and
   means for postponing the initiation of the insertion stroke of the component insertion head until the specified period of time has elapsed.

3. The system of claim 2 further comprising:
   means, responsive to the elapsing of the specified period of time, for initiating a count of clock pulses corresponding to the specified period of time whereby the specified period of time is again established for the next insertion cycle of the component insertion machine.

4. The system of claim 1 further comprising:

means for verifying that the receiving medium has reached the final commanded position during the insertion stroke of the component insertion head; and means for automatically commanding another movement of the receiving medium to another position in response to a verification that the receiving medium has reached the previous final commanded position.

5. The system of claim 1 further comprising:

means for commanding a set of movements for the receiving medium along a set of axes wherein said means for verifying that the receiving medium has reached a position relative to a final commanded position monitors the status of movements along both axes so as to only authorize the initiation of an insertion stroke when movements of less than a predetermined amount remain to be implemented along each axis.

6. The system of claim 5 further comprising:

means for monitoring when the component insertion head reaches a downward position during the insertion stroke; and means for verifying that the receiving medium has completed the finite distances along each respective axis of motion before the component insertion head has reached the downward position whereby the component is thereafter further processed and the insertion head begins a return stroke to an up position.

7. The system of claim 6 further comprising:

means for monitoring when the component insertion head reaches a position clear of the receiving medium; and means responsive to the clearing of the receiving medium for accessing the next set of movements for the receiving medium whereby said commanding means is operative to command the next set of accessed movements as the component insertion head continues to move to an up position.

8. The system of claim 6 further comprising:

means for monitoring when the component insertion head has reached an up position; and means for arbitrarily defining a period of time relative to when the component insertion head previously reached the up position, the arbitrarily defined period of time having not elapsed when the component insertion head reaches the currently monitored up position whereby the initiation of the next insertion stroke is postponed until the arbitrarily defined period of time has elapsed.

9. A control system for controlling the rate at which electrical components are inserted into a receiving medium that is positioned relative to a component insertion head in response to a set of commanded movements said system comprising:

means for defining a constant period of time between successive insertions of electrical components into the positioned receiving medium;

means for monitoring the commanded movements so as to define when predetermined amounts of commanded movement remain to be executed; and means for authorizing a downward movement of the component insertion head when only the predetermined amounts of commanded movement remain to be executed and the constant period of time has elapsed between successive insertions of electrical components.

10. The control system of claim 9 wherein the component insertion head moves in a reciprocal manner so as to return to an upward position following the insertion of a component into the receiving medium and wherein said means for defining a constant period of time between successive component insertions comprises:

means for selecting a constant period of time from among a plurality of time periods wherein at least one constant period of time represents the shortest cyclical period of time for the component insertion head premised on the component insertion head being immediately authorized to move downwardly when the upward position has been reached and only the predetermined amounts of movement remain to be executed.

11. The control system of claims 9 or 10 wherein said means for defining a constant period of time further comprises:

means for generating a train of clock pulses of predefined frequency; and means for counting when a predetermined number of clock pulses have occurred relative to the last authorization of a downward stroke of the component insertion head, the predetermined number of clock pulses corresponding to the selected constant period of time.

12. The control system of claim 11 wherein said means for counting when a predetermined period of clock pulses has occurred is operative to initiate counting when the component insertion head has reached the upward position and only the predetermined amounts of movement remain to be executed.

13. The control system of claim 9 wherein said means for monitoring the commanded movements comprises:

means for initially storing the set of commanded movements; and means for feeding back the movement of the receiving medium to said means for initially storing the set of commanded movements whereby the initially stored set of commanded movements is changed to reflect the amounts of movement left to be implemented.

14. The control system of claim 13 wherein said means for monitoring the commanded movements further comprises:

means for generating a set of separate signals indicative of when the currently stored amounts of movement reach the respective predetermined amounts of movement specified for each of two axes of movement.

15. The control system of claim 14 wherein said means for authorizing a downward movement of the component insertion head is responsive to the condition when both of the separate signals indicate that the currently stored amounts of movement have reached the respective predetermined amounts of movement specified for the two axes of movement.

* * * * *